(12) United States Patent
Wada et al.

(10) Patent No.: US 11,845,608 B2
(45) Date of Patent: Dec. 19, 2023

(54) SUSPENSION TYPE TRANSPORT VEHICLE AND STORAGE SYSTEM

(71) Applicant: Murata Machinery, Ltd., Kyoto (JP)

(72) Inventors: Eiji Wada, Aichi (JP); Kazuya Iwata, Aichi (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 17/775,823

(22) PCT Filed: Sep. 15, 2020

(86) PCT No.: PCT/JP2020/034894
§ 371 (c)(1),
(2) Date: May 10, 2022

(87) PCT Pub. No.: WO2021/095350
PCT Pub. Date: May 20, 2021

(65) Prior Publication Data
US 2022/0380125 A1 Dec. 1, 2022

(30) Foreign Application Priority Data

Nov. 12, 2019 (JP) ................................. 2019-204845

(51) Int. Cl.
*B65G 1/04* (2006.01)
*B65G 49/06* (2006.01)

(52) U.S. Cl.
CPC ......... *B65G 1/0457* (2013.01); *B65G 49/061* (2013.01); *B65G 2201/0297* (2013.01); *B65G 2203/0283* (2013.01); *B65G 2203/042* (2013.01)

(58) Field of Classification Search
CPC ................ B65G 1/0407; B65G 1/0457; B65G 2201/0297; B65G 2203/0283;
(Continued)

(56) References Cited

U.S. PATENT DOCUMENTS 3,428,195 A * 2/1969 Pamer .................. B65G 1/0407
212/346
3,863,772 A * 2/1975 Schwartz ................ B66C 13/46
212/320
(Continued)

FOREIGN PATENT DOCUMENTS

JP 4348613 10/2009
JP 2012240795 12/2012
(Continued)

OTHER PUBLICATIONS

International Preliminary Report on Patentability in International Appln. No. PCT/JP2020/034894, dated May 27, 2022, 6 pages.
(Continued)

*Primary Examiner* — Glenn F Myers
(74) *Attorney, Agent, or Firm* — Keating & Bennett, LLP

(57) ABSTRACT

A suspended transport vehicle travels along a track supported by a ceiling and transfers an article to a shelf of a rack installed on a floor, the suspended transport vehicle has a driving part, a first traveling part and a second traveling part, a ceiling-side member that is suspended downwards from the first traveling part and the second traveling part and has a transferring part that transfers the article to the shelf of the rack, a floor-side member that is provided so as to be capable of relative movement with respect to the ceiling-side member and has travel rollers being contacting parts in contact with a first guide part installed on the floor, and a distance sensor that detects a relative distance between the ceiling-side member and the floor-side member.

10 Claims, 5 Drawing Sheets

(58) Field of Classification Search
CPC ............ B65G 2203/042; B65G 49/061; H01L 21/67259; H01L 21/67706; H01L 21/6773; H01L 21/67736; H01L 21/67769; H01L 21/67733; B66F 9/07; B66F 9/072; B66F 9/08
USPC ........................................................ 414/281
See application file for complete search history.

(56) References Cited

U.S. PATENT DOCUMENTS

| 2014/0072392 A1* | 3/2014 | Tanahashi | ................. | B66F 9/07 |
| | | | | 414/277 |
| 2015/0259141 A1* | 9/2015 | Yamada | ............... | B65G 1/0435 |
| | | | | 414/267 |

FOREIGN PATENT DOCUMENTS

| JP | 5339165 | 11/2013 |
| JP | 2018070307 | 5/2018 |
| WO | WO2010143269 | 12/2010 |
| WO | WO2018074129 | 4/2018 |
| WO | WO2021095350 | 5/2021 |

OTHER PUBLICATIONS

International Search Report in International Appln. No. PCT/JP2020/034894, dated Nov. 24, 2020, 5 pages (with English Translation).

\* cited by examiner

SUSPENSION TYPE TRANSPORT VEHICLE AND STORAGE SYSTEM

CROSS-REFERENCE TO RELATED APPLICATIONS

This application is a National Stage Application under 35 U.S.C. § 371 and claims the benefit of International Application No. PCT/JP2020/034894, filed Sep. 15, 2020, which claims priority to JP Provisional Patent Application Serial No. 2019-204845, filed on Nov. 12, 2019. The entire contents of which is incorporated herein by reference.

TECHNICAL FIELD

An aspect of the present invention relates to a suspended transport vehicle and a storage system.

BACKGROUND ART

An article handling system is a known material handling device for transferring articles from/to racks in an automated warehouse. The article handling system includes a traveling part, which travels along a track suspended from a ceiling of the warehouse and is provided with a driving part for driving a wheel, and a transferring part, which is suspended by the traveling part and transfers an article from/to the rack.

In such an article handling system, distance or length of a hoist cable lowered from the traveling part and a position of a shelf are associated with each other and recorded. Thus, the position of the transferring part for transferring articles from/to the rack is determined on the basis of the height position of the ceiling. However, the distortion of the ceiling may be caused by any temperature change or snow weight. This may change the relative position between the vertical position of the shelf of the rack placed on a floor and the height position of the ceiling, preventing the transferring part from transferring the article.

CITATION LIST

Patent Literature

Patent Document 1: Japanese Patent No. 5339165

SUMMARY OF INVENTION

Technical Problem

A material handling system according to Patent Document 1 includes a distance sensor on each rack to measure the distance to the bracket attached to a track (the relative distance to the height of a ceiling on the basis of the height of a shelf of the rack). This enables the distance between the vertical position of each rack and the height position of the ceiling to be measured. As a result, the distortion amount of the ceiling can be acquired. Based on the acquired distortion amount, the position of an article to be transferred with a transferring part can be corrected and the transferring part can be maintained. However, in the above-described conventional method, a distance sensor is required for all racks, causing an increase in cost.

One aspect of the present invention provides a suspended transport vehicle and a storage system that allow the distortion amount of the ceiling to be measured at low cost.

Solution to Problem

A suspended transport vehicle according to one aspect of the present invention travels along a track supported by a ceiling, transfers an article to a shelf of a rack installed on a floor, and comprises a traveling part, a ceiling-side member, a floor-side member, and a distance detecting part. The traveling part includes a wheel configured to travel along the track and a driving part configured to drive the wheel. The ceiling-side member suspended downwards from the traveling part and includes a transferring part configured to transfer the article to the shelf of the rack. The floor-side member is provided so as to be capable of relative movement with respect to the ceiling-side member and includes a contacting part in contact with the floor or a member installed on the floor. The distance detecting part is configured to detect a relative distance between the ceiling-side member and the floor-side member.

The suspended transport vehicle with this configuration includes the ceiling-side member and the floor-side member. The ceiling-side member is suspended downwards from the traveling part which travels on the track supported by the ceiling. The floor-side member is provided so as to move in the vertical direction and contacts with the floor or with a member provided on the floor. The distance detecting part detects the relative distance between the ceiling-side member and the floor-side member. This enables the distance to the height position of the ceiling to be measured based on the height position of the floor at the position of the suspended transport vehicle. As a result, the distortion amount of the ceiling can be acquired. The suspended transport vehicle with this configuration, only requires the distance sensor to be provided on the suspended transport vehicle, thus enabling the distortion amount of the ceiling to be acquired at low cost.

In a suspended transport vehicle according to one aspect of the present invention, the ceiling-side member may include a mast extending downwards from the traveling part and a vertically-moving part provided so as to be capable of vertical movement along the mast and on which the transferring part is provided. The suspended transport vehicle further may comprise a controller configured to control vertical movement of the vertically-moving part. The controller may determine a height position of the vertically-moving part when transferring the article to the shelf of the rack based on the relative distance detected by the distance detecting part. With this configuration, even if the ceiling is distorted, the vertical position of the vertically-moving part is determined on the basis of its distortion amount. Therefore, the transferring part can transfer an article in an appropriate manner.

In a suspended transport vehicle according to one aspect of the present invention, the floor-side member may include a travel roller being the contacting part and an inclination-preventing guide roller guided by a guide member provided on the floor and being configured to prevent the mast from inclining at a predetermined angle or more from a vertical direction. With this configuration, the floor-side unit including the travel roller and the guide roller is provided movably to/from the ceiling-side unit, which can prevent the travel roller from being damaged and also prevents the inclination-preventing guide roller from coming off the guides even if the ceiling is distorted.

In a suspended transport vehicle according to one aspect of the present invention, the distance detecting part may include a reflective member and a distance sensor configured to detect a distance to the reflective member. The ceiling-side member may be provided with the reflective member and the floor-side member is provided with the distance sensor or the ceiling-side member is provided with the distance sensor and the floor-side member is provided with the reflective member. This configuration allows the relative distance between the ceiling-side member and the floor-side member to be detected easily at a low cost.

In a suspended transport vehicle according to one aspect of the present invention, the distance sensor may be provided in the ceiling-side member and the reflective member is provided in the floor-side member. With this configuration, it is unnecessary to provide a cable connecting the distance sensor with the controller between the ceiling-side unit and the floor-side unit, thus making it possible to prevent cable damage.

A storage system according to one aspect of the present invention includes the above suspended transport vehicle and a rack, which is provided on the floor and to which the article is transferred by the transferring part of the suspended transport vehicle. The suspended transport vehicle included in the storage system with this configuration includes the ceiling-side member and the floor-side member. The ceiling-side member is suspended downwards from the traveling part which travels on the track supported by the ceiling. The floor-side member is provided so as to move in the vertical direction and contacts with the floor or with a member provided on the floor. The suspended transport vehicle also includes the distance sensor to detect the relative distance between the ceiling-side member and the floor-side member. This makes it possible to acquire the distance to the height position of the ceiling based on the height position of the floor at the position where the suspended transport vehicle is placed, that is, the distortion amount of the ceiling. The storage system with this configuration only requires the distance sensor to be provided in the suspended transport vehicle, thus enabling the distortion amount of the ceiling to be acquired at low cost.

Advantageous Effects of Invention

According to one aspect of the present invention, the distortion amount of the ceiling can be acquired at low cost.

DETAILED DESCRIPTION OF EMBODIMENTS

Figure 1:
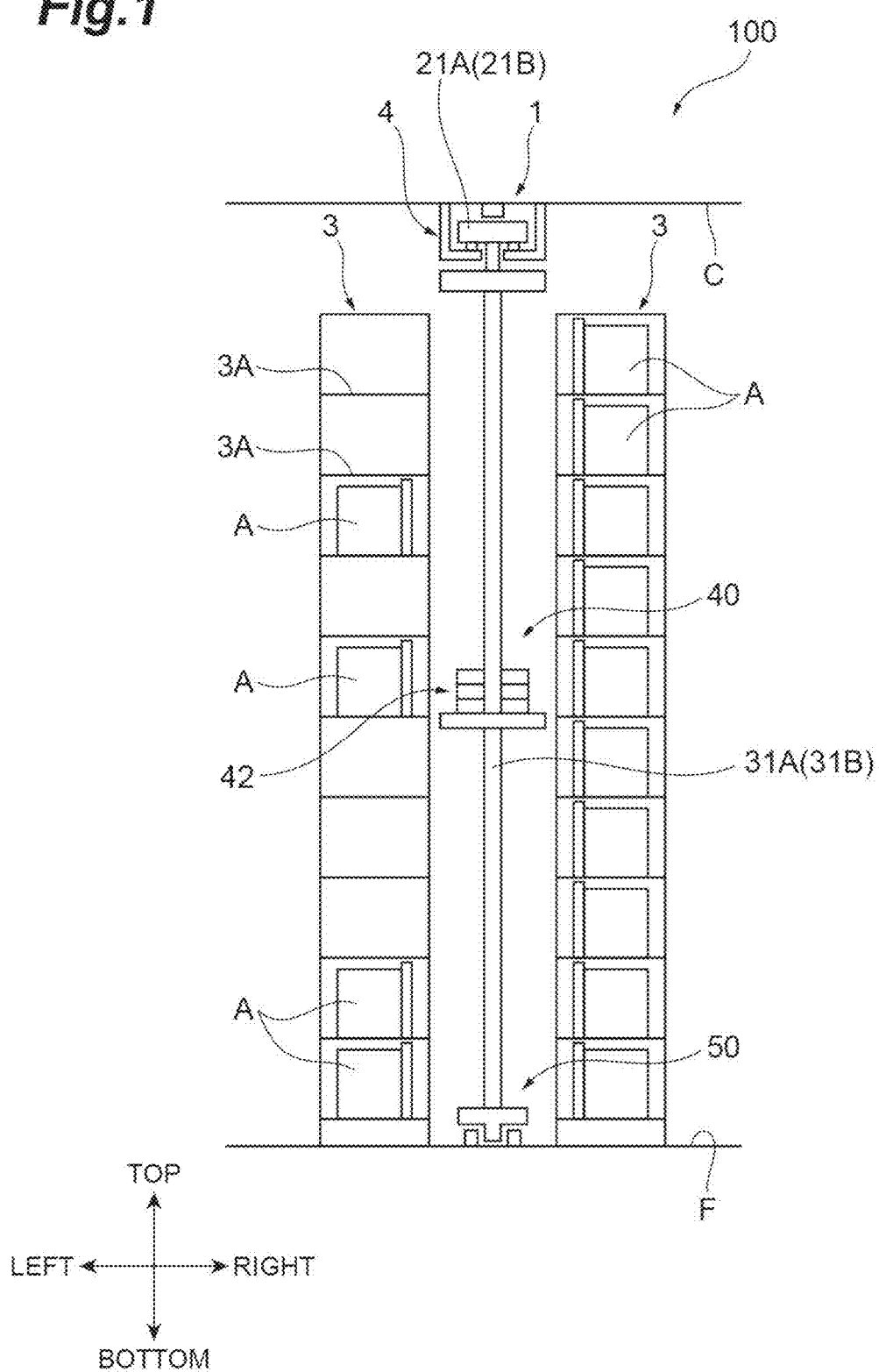
FIG. 1 is a side view illustrating the overall configuration of a storage system according to an embodiment of the present invention.

Hereinafter, a suspended transport vehicle 1 and a storage system 100 according to an embodiment of the present invention will now be described with reference to the attached drawings. Similar components are denoted by the same characters in the drawings so as to avoid repeated explanation. Hereinafter, the traveling direction of the suspended transport vehicle 1 may be referred to as "front", and the opposite direction as "rear". When the suspended transport vehicle 1 is seen from the front side, the right side in the width direction may be referred to as "right" and the left side as "left". The sides in the vertical direction may be referred to as "top" and "bottom", respectively.

The storage system 100 is provided in an automated warehouse installed in a semiconductor production facility, for example. As shown in FIG. 1, the storage system 100 includes the suspended transport vehicle 1 and a rack 3, which is arranged along the traveling route of the suspended transport vehicle 1 and placed on a floor F. The suspended transport vehicle 1 carries an article A such as a FOUP (Front Opening Unify Pod) and delivers (transfers) the article A from/onto a shelf 3A of the rack 3.

Figure 2:
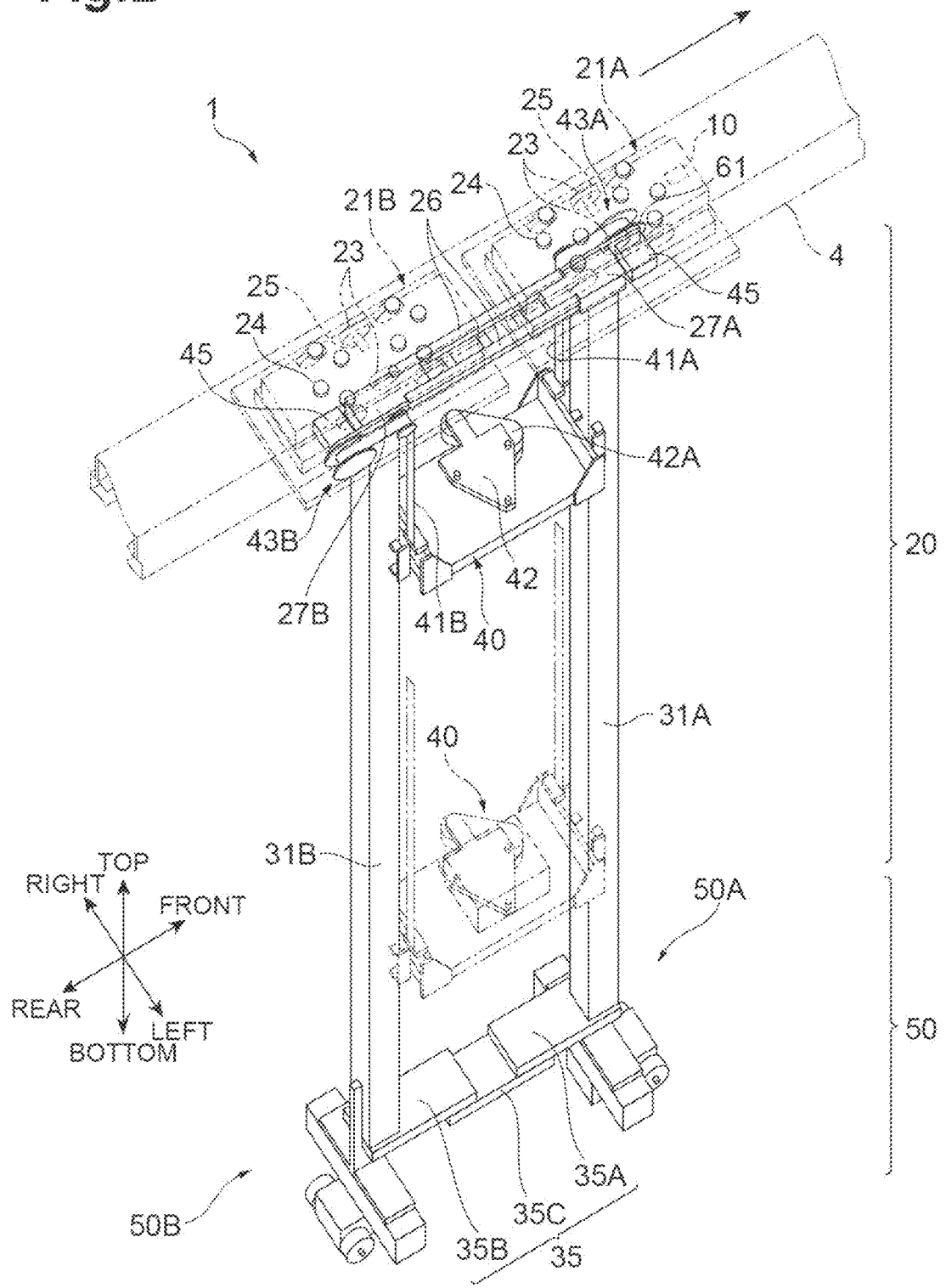
FIG. 2 is a perspective view of the suspended transport vehicle shown in FIG. 1 as seen from diagonally above.

As shown in FIGS. 1 and 2, the suspended transport vehicle 1 includes a ceiling-side unit (ceiling-side member) 20, a floor-side unit (floor-side member) 50, and a controller 10. The ceiling-side unit 20 includes a first traveling vehicle (traveling part) 21A, a second traveling vehicle (traveling part) 21B, a first mast 31A, a second mast 31B, a bottom frame 35, and a vertically-moving part 40.

The first traveling vehicle 21A and the second traveling vehicle 21B are arranged at the top of the suspended transport vehicle 1 and travel together in the traveling direction along a track 4. The track 4 is suspended from a ceiling with an instrument such as a hanging bracket (not illustrated).

The first traveling vehicle 21A includes driving wheels (wheel) 23, driven wheels 24, and a drive motor (driving part) 25. The drive motor 25 drives and rotates the driving wheels 23 while in contact with the track 4, so as to cause the first traveling vehicle 21A to travel. The driven wheels 24 come in contact with an appropriate part of the track 4 so as to guide the first traveling vehicle 21A along the track 4. The second traveling vehicle 21B is identical or substantially identical to the first traveling vehicle 21A, and the explanation thereof is omitted.

An upper frame 26, which is a frame-like (ladder-like) component, is formed longitudinally parallel to the track 4 and arranged at the center in the width direction of the track 4. Block-like joints 27A, 27B are fixed to both ends of the upper frame 26 in a longitudinal direction. A structure including the upper frame 26 and the joints 27A, 27B is installed so that the first traveling vehicle 21A and the second traveling vehicle 21B can be linked to each other.

The upper end of the first mast 31A is fixed to the front end of the upper frame 26 via the joint 27A. The upper end of the second mast 31B is fixed to the rear end of the upper frame 26 via the joint 27B. The first mast 31A and the second mast 31B are formed longitudinally in the vertical direction. In other words, the first mast 31A and the second mast 31B are suspended by the first traveling vehicle 21A and the second traveling vehicle 21B and extend downwards. Further, the first mast 31A and the second mast 31B are disposed at the center in the left-right direction of the track 4.

The lower ends of the first mast 31A and the second mast 31B are connected together by the bottom frame 35 disposed parallel to the track 4. The bottom frame 35 includes a first bottom frame 35A, a second bottom frame 35B, and a third bottom frame 35C. The first bottom frame 35A is fixed to the bottom end of the first mast 31A. The second bottom frame 35B is fixed to the bottom end of second mast 31B. The third bottom frame 35C connects the first bottom frame 35A with the second bottom frame 35B.

The vertically-moving part 40 is disposed between the first mast 31A and the second mast 31B. The vertically-moving part 40 is suspended from and supported by a first belt (hoist cable) 41A and a second belt (hoist cable) 41B (to be described later). The vertically-moving part 40 is movable (capable of elevating) along the longitudinal direction, that is, the vertical direction of the first mast 31A and the second mast 31B. The vertically-moving part 40 has a well-known guiding mechanism which guides the movement direction of the vertically-moving part 40. The guiding mechanism may include, for example, a plurality of small rollers (not illustrated) that are capable of contact with the first mast 31A and the second mast 31B.

The vertically-moving part 40 is provided with a transferring part 42 that transfers an article A between the suspended transport vehicle 1 and, for example, a shelf 3A of the rack 3. The transferring part 42 is provided with an arm 42A that is capable of extending and retracting in the left-right horizontal direction, and configured so as to enable the article A to rest on a leading end of the arm 42A. Alternately, another component such as a robotic arm may be used for the transferring part 42.

A first hoist 43A and a second hoist 43B are disposed as a pair on the first traveling vehicle 21A and the second traveling vehicle 21B, respectively. The first hoist 43A and the second hoist 43B are disposed so as to correspond to a first belt 41A and a second belt 41B, respectively, which suspend the vertically-moving part 40. The first hoist 43A and the second hoist 43B are driven at the same time to reel in or feed out the first belt 41A and the second belt 41B, respectively, so as to cause the vertically-moving part 40 to move vertically. The first belt 41A and the second belt 41B are each reeled in or fed out by driving elevator motors 45.

Figure 4:
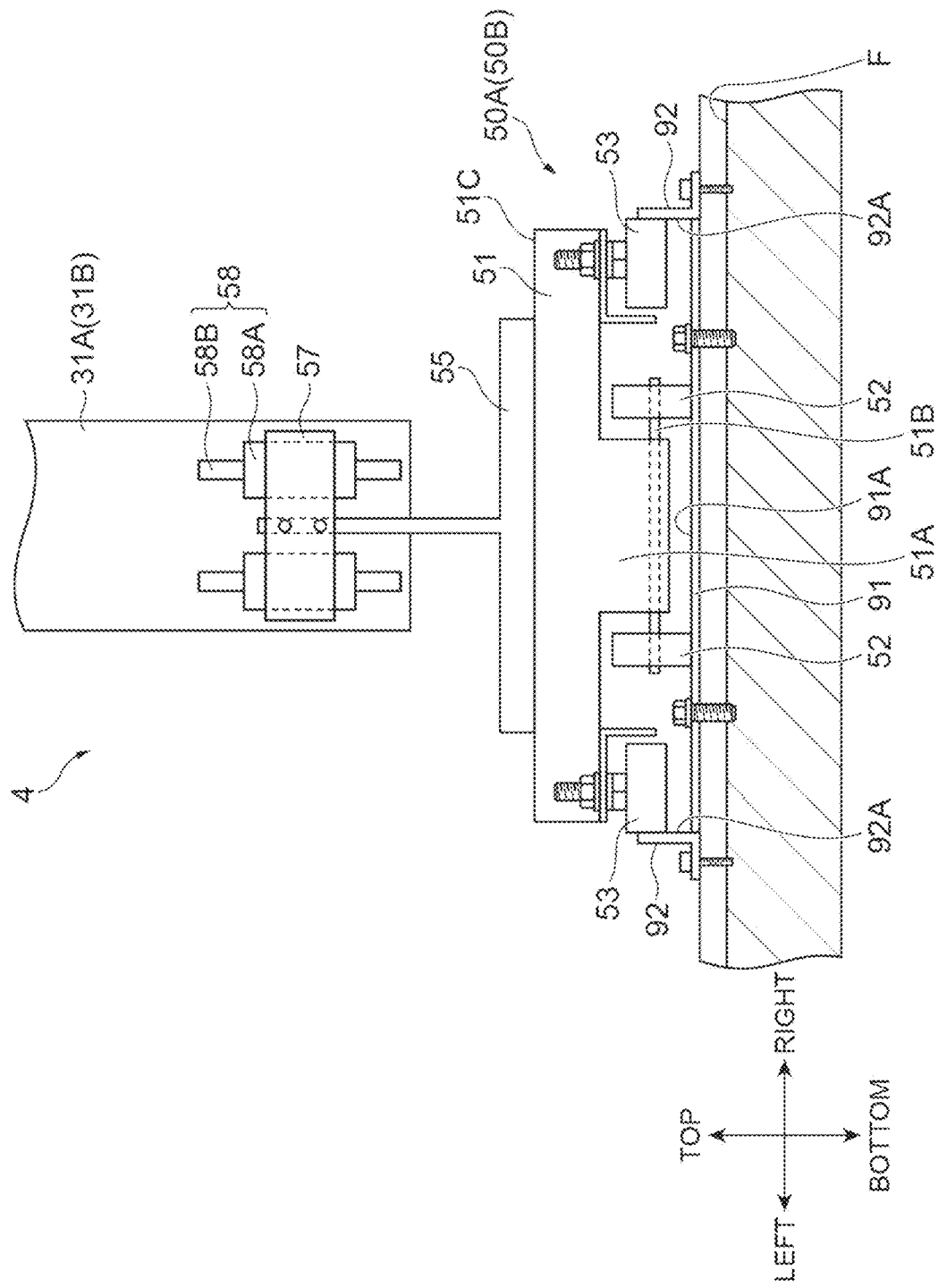
FIG. 4 is an expanded side view illustrating the floor-side unit and masts of the suspended transport vehicle shown in FIG. 1.

As shown in FIG. 4, a plate-like first guide (a member attached to the floor) 91 and L-shaped second guides (guiding member) 92, 92 are attached to a floor F. The first guide 91 includes a guide surface 91A on which travel rollers (contacting part) 52 rolls and moves. Each of the second guides 92 includes a guide surface 92A along which a guide roller 53 can roll.

Figure 3:
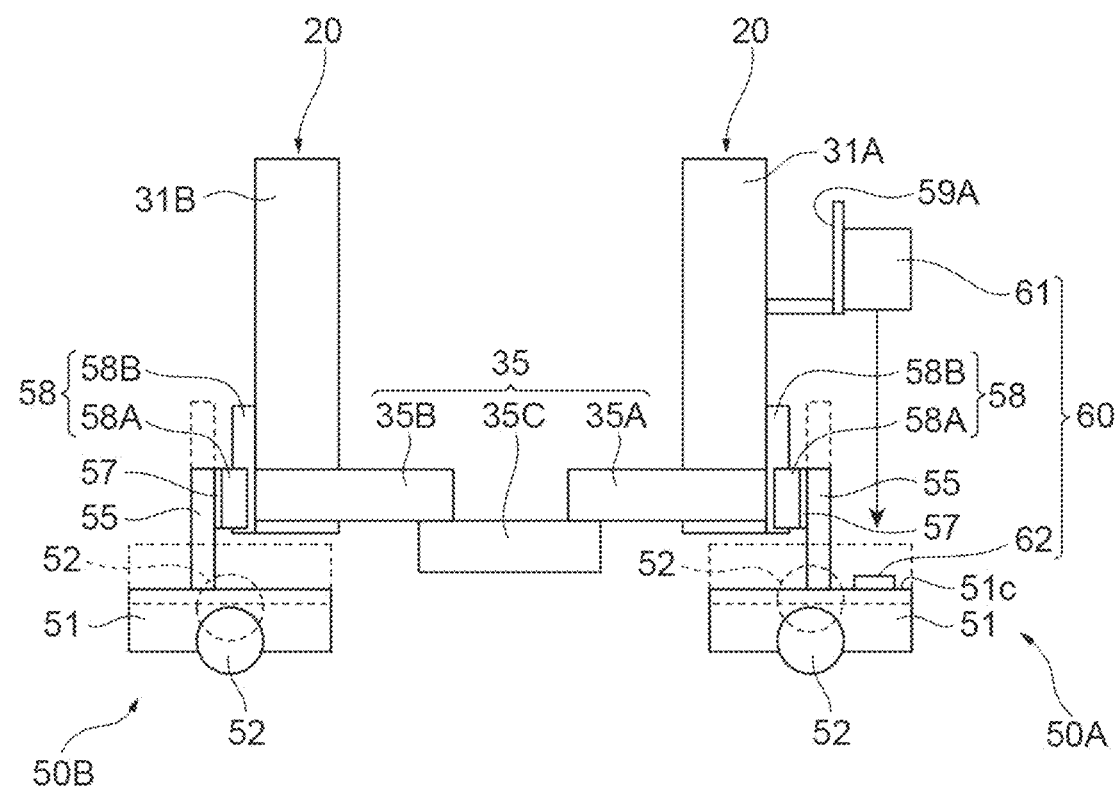
FIG. 3 is a front view illustrating the schematic configuration of the floor-side unit of the suspended transport vehicle shown in FIG. 1.
Figure 3:
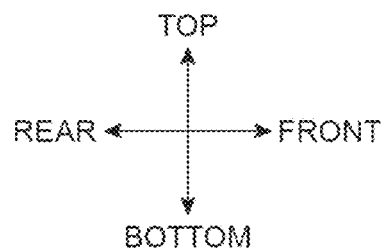

As shown in FIG. 2, the floor-side unit 50 includes a first guide unit 50A and a second guide unit 50B. As shown in FIGS. 3 and 4, the first guide unit 50A is fixed to the first bottom frame 35A so as to enable movement in a vertical direction. The second guide unit 50B is fixed to the second bottom frame 35B so as to enable movement in a vertical direction. The first guide unit 50A includes a main body frame 51, the travel rollers 52, the guide rollers 53, a connector 55, and a support 57.

The main body frame 51 extends in the left-right direction, and the travel rollers 52, the guide rollers 53 and the connectors 55 are attached thereto. The travel rollers 52 are attached so as to contact with the first guide 91. According to the present embodiment, the travel rollers 52 are attached so as to be capable of rolling along the guide surface 91A. The travel rollers 52 are attached to a shaft 51B that is rotatably provided on a downward-protruding attachment 51A. The guide rollers 53 are disposed in order to prevent the first mast 31A and the second mast 31B from inclining at a predetermined angle or more from the vertical direction. The guide rollers 53 are provided so as to roll and move on the guide surfaces 92A. The guide rollers 53 are attached to the bottom surface of the main body frame 51. The connector 55 and the support 57 are used to attach the first guide unit 50A so as to enable movement to the first mast 31A.

The connector 55 is connected to the support 57 which supports linear guides 58. The linear guides 58 are well-known guiding members that allow smooth movement in an extending direction of rails. The linear guides 58, each of which includes sliders 58A and rails 58B, allow the first guide unit 50A to be provided movably on the first mast 31A in the vertical direction. The sliders 58A are provided so as to slide in the extending direction of the rails 58B, and the rails 58B are fixed to the first mast 31A. The sliders 58A are disposed on the support 57, that is, in the first guide unit 50A.

As shown in FIG. 3, the suspended transport vehicle 1 includes a distance detecting part 60 that measures and obtains a relative distance between the ceiling-side unit 20 and the first-guide unit 50A. The distance detecting part 60 includes a distance sensor 61 and a reflector 62. The distance sensor 61 is attached to the first mast 31A via a bracket 59A. The reflector (reflecting unit) 62 is attached to the upper surface 51C of the main body frame 51 in the first guide unit 50A. The distance sensor 61 detects the distance to the reflector 62. The distance sensor 61 obtains a relative distance between the ceiling-side unit 20 and the first guide unit 50A and transmits it to the controller 10.

Figure 5:
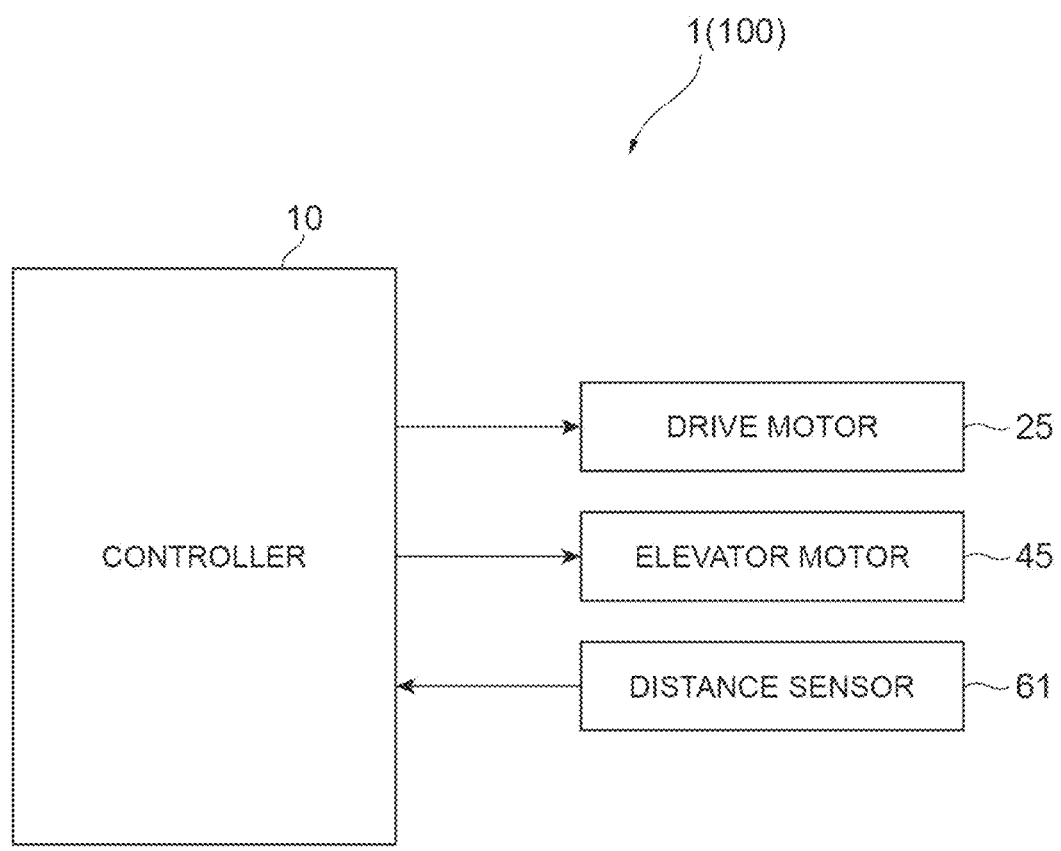
FIG. 5 is a block diagram illustrating the functional configuration of the suspended transport vehicle shown in FIG. 1.

As shown in FIG. 5, the controller 10 (refer to FIG. 1) controls the suspended transport vehicle 1 in its entirety. More precisely, the controller 10 controls the drive motors 25 and the elevator motors 45. The controller 10 is included in, for example, the first traveling vehicle 21A.

The controller 10 includes memory media such as an input/output interface which inputs or outputs signals externally, ROM (Read Only Memory) in which programs and information for processing are stored, and RAM (Random Access Memory) which stores data temporarily, CPU (Central Processing Unit), and a communication circuit. On the basis of the signal which is output from CPU, the controller 10 stores input data in RAM, loads a program stored in ROM to RAM, and runs the program loaded in RAM to perform various types of processing.

The controller 10 of the suspended transport vehicle 1 according to the present embodiment associates the height positions of each shelf 3A with the distances or the lengths of the first belt 41A and the second belt 41B fed out from the first traveling vehicle 21A and the second traveling vehicle 21B, and stores this association. On the basis of the height of a ceiling C, the controller 10 determines the position of the transferring part 42 which transfers an article A from/to the shelf 3A of the rack 3. The controller 10 according to the preferred embodiment of the present invention determines the height of the vertically-moving part 40 for transferring an article A from/to the shelf 3A of the rack 3 on the basis of the relative distance detected by the distance sensor 61. When an article A is transferred to a predetermined shelf 3A and there is a difference between the relative distance from/to the shelf 3A stored in the controller 10 and the relative distance from/to the shelf 3A detected by the distance sensor 61, the controller 10 corrects the previously stored distances (heights) of the first belt 41A and the second belt 41 B to be fed out.

We will now describe the operational effect of the suspended transport vehicle 1 according to the embodiment and the storage system 100 including the same. In the suspended transport vehicle 1 according to the above embodiment the floor-side unit 50 is provided so as to be capable of movement in the vertical direction relative to the ceiling-side unit 20, which is suspended downwards from the first traveling vehicle 21A and the second traveling vehicle 21B that travel along the ceiling C. The floor-side unit 50 is also provided so as to contact with a first guide 91 provided on the floor. The relative distance between the ceiling-side unit 20 and the floor-side unit 50 is acquired by the distance sensor 61. This makes it possible to acquire the distance to the height position of the ceiling C, that is, the distortion amount of the ceiling C, based on the height position of the floor surface F at the position where the suspended transport vehicle 1 is placed. The storage system 100 comprising the suspended transport vehicle 1 with this configuration only requires the distance sensor 61 to be provided on the suspended transport vehicle 1, thus enabling the distortion amount of the ceiling C to be acquired with a low-cost configuration.

Furthermore, such a configuration makes it possible to acquire the distortion of the ceiling C, so that the track 4 need not be suspended from or supported by the rack 3 installed on the floor F. A storage system with a configuration in which the track 4 is suspended from or supported by the rack 3 requires the rack to be strong, increasing the weight and cost. In addition, vibration occurring in the track 4 when the suspended transport vehicle 1 travels is propagated to the rack 3 (shelf 3A). However, the storage system 100 according to the above embodiment does not require such measures for the rack 3 with respect to such a storage system, thus making it possible to minimize increases in the weight and cost of configuring the rack 3. The storage system 100 according to the preferred embodiment provides the rack 3 and the track 4 independently of each other, thus making it possible to prevent vibration from occurring in the rack 3.

In the suspended transport vehicle 1 according to the above embodiment and the storage system 100 including the same, the controller 10 determines the height of the vertically-moving part 40 to transfer an article from/to the shelf 3A of the rack 3 on the basis of the relative distance detected by the distance sensor 61. The height of the vertically-moving part 40 is determined on the basis of the amount of distortion even if the ceiling C is distorted, so that the transferring part 42 can transfer an article A in an appropriate manner.

In the suspended transport vehicle 1 according to the above preferred embodiment and the storage system 100 including the same, the position of the transferring part 42 to transfer an article can be controlled in an appropriate manner based on the relative distance detected by the distance sensor 61, eliminating the need to design the shelf 3A in view of distortion of the ceiling C. It is unnecessary to secure space for the shelf 3A in consideration of the distortion of the ceiling C, and thus the size of the rack 3 in the vertical direction can be minimized. In other words, the storage system 100 including the suspended transport vehicle 1 according to the above embodiment makes it possible to prevent a reduction in the number of the shelf 3A units that can be installed in a facility.

In the suspended transport vehicle 1 according to the above embodiment and the storage system 100 including the same, the floor-side unit 50 including the travel rollers 52 and the guide rollers 53 is movably provided with respect to the ceiling-side unit 20. This can prevent the travel rollers 52 from being damaged, and also prevent the inclination-preventing guide rollers 53 from coming off from the second guides 92 even when the ceiling C is distorted.

In the suspended transport vehicle 1 according to the above preferred embodiment and the storage system 100 including the same, the distance detecting part 60 includes the reflector 62 and the distance sensor 61 that detects the distance to the reflector 62. This enables the relative distance between the ceiling side-unit 20 and the floor-side unit 50 to be measured and obtained easily at a low cost. Attaching the distance sensor 61 to the suspended transport vehicle 1 makes it easier to secure a sensor setting space and provide a cover for disturbance prevention compared to when the distance sensor 61 is attached to the rack 3. This makes it possible to improve the precision of the distance acquired by the distance sensor 61.

In the suspended transport vehicle 1 according to the embodiment and the storage system 100 including the same, the distance sensor 61 is included in the ceiling-side unit 20 and the reflector 62 is included in the floor-side unit 50. This eliminates the need for providing a cable (not illustrated) between the ceiling-side unit 20 and the floor-side unit 50 to connect the distance sensor 61 with the controller 10. This prevents the cable from being damaged.

The embodiment is not limited to the one aspect described above. Various modifications can be made without departing from the scope of this aspect of the invention.

The above embodiments described an example of the suspended transport vehicle 1 including two traveling vehicles, the first traveling vehicle 21A and the second traveling vehicle 21B. However, the suspended transport vehicle 1 may be constituted by a single traveling vehicle. Further, according to the suspended transport vehicle 1 of the embodiment of the present invention described above, the vertically-moving part 40 moves vertically along the first mast 31A and the second mast 31B. However, suspending the vertically-moving part 40 from the traveling vehicle supported by the ceiling C would eliminate the need for the first mast 31A and the second mast 31B mast.

The above embodiment and modification example described the linear guides 58 that allow the floor-side unit 50 to move relative to the ceiling-side unit 20. Instead of the linear guides 58, however, a member that can move reciprocally along a straight, line such as an elastic or a cylinder, may also be used.

The above preferred embodiment and modification example described that the distance detecting part 60 includes the reflector 62 and the distance sensor 61 that detects the distance to the reflector 62, but the invention is not limited to this aspect. For example, an amount of movement of the sliders 58A on the rails 58B may be detected if the linear guides 58 are used, and, for example, an amount of extension of elastic members may be detected if elastic members are used instead of the linear guides 58.

According to the above preferred embodiment and modification example, the distance sensor 61 is included in the ceiling-side unit 20, and the reflector 62 is included in the floor-side unit 50. Alternatively, the distance sensor 61 may be included in the floor-side unit 50, and the reflector 62 may be included in the ceiling-side unit 20.

In addition to the above configurations of the suspended transport vehicle 1 according to the preferred embodiment and modification example of the present invention, a distance sensor that detects the distance to the rack 3 in the horizontal direction (left-right direction) may be provided. With a configuration including this distance sensor, movement of an article A or the arm 42A of the transferring part 42 may be identified based on detection of a member in the horizontal direction constituting the rack 3 (shelf) or a member in a vertical direction (beam). This can prevent the article A or the arm 42A of the transferring part 42 from crashing into the rack 3.

In the storage system 100 according to the above preferred embodiment and modification example, the first guide 91 is installed on the floor F, and the travel rollers 52 of the suspended transport vehicle 1 contact with the first guide 91. However, the travel rollers 52 may be in contact with the floor F without the first guide 91 being installed on the floor F.

REFERENCE SIGNS LIST

1: suspended transport vehicle
3: Rack
3A: Shelf
4: Track
10: Controller
20: Ceiling-side unit (ceiling-side member)
21A: First traveling vehicle (traveling part)
21B: Second traveling vehicle (traveling part)
25: Drive motor (driving part)
31A: First mast
31B: Second mast
40: Vertically-moving part
42: Transferring part
50: Floor-side unit (floor-side member)
50A: First guide unit
50B: Second guide unit
52: Travel roller (contacting part)
53: Guide roller
58: Linear guide
60: Distance detecting part
61: Distance sensor
62: Reflector
91: First guide (member installed on floor)
92: Second guide (guide member)
C: Ceiling
F: Floor

The invention claimed is:

1. A suspended transport vehicle configured to travel along a track supported by a ceiling and to transfer an article to a shelf of a rack installed on a floor, the suspended transport vehicle comprising:
a traveling part including a wheel configured to travel along the track and a driving part configured to drive the wheel;
a ceiling-side member suspended downwards from the traveling part and including a transferring part configured to transfer the article to the shelf of the rack;
a floor-side member provided so as to be capable of relative movement in a vertical direction with respect to the ceiling-side member and including a contacting part in contact with the floor or a member installed on the floor; and
a distance detecting part configured to detect a relative distance between the ceiling-side member and the floor-side member.

2. The suspended transport vehicle according to claim 1, wherein the ceiling-side member includes a mast extending downwards from the traveling part and a vertically-moving part provided so as to be capable of vertical movement along the mast and on which the transferring part is provided,
the suspended transport vehicle further comprises a controller configured to control vertical movement of the vertically-moving part, and
the controller is configured to determine a height position of the vertically-moving part when transferring the article to the shelf of the rack based on the relative distance detected by the distance detecting part.

3. The suspended transport vehicle according to claim 2, wherein the floor-side member includes a travel roller being the contacting part and an inclination-preventing guide roller guided by a guide member provided on the floor and being configured to prevent the mast from inclining at a predetermined angle or more from the vertical direction.

4. The suspended transport vehicle according to claim 1, wherein the distance detecting part includes a reflective member and a distance sensor configured to detect a distance to the reflective member, and
the ceiling-side member is provided with the reflective member and the floor-side member is provided with the distance sensor or the ceiling-side member is provided with the distance sensor and the floor-side member is provided with the reflective member.

5. The suspended transport vehicle according to claim 4, wherein the distance sensor is provided in the ceiling-side member and the reflective member is provided in the floor-side member.

6. A storage system comprising:
a suspended transport vehicle configured to travel along a track supported by a ceiling and to transfer an article to a shelf of a rack provided on a floor, the suspended transport vehicle comprising:
a traveling part including a wheel configured to travel along the track and a driving part configured to drive the wheel;
a ceiling-side member suspended downwards from the traveling part and including a transferring part configured to transfer the article to the shelf of the rack;
a floor-side member provided so as to be capable of relative movement in a vertical direction with respect to the ceiling-side member and including a contacting part in contact with the floor or a member installed on the floor; and
a distance detecting part configured to detect a relative distance between the ceiling-side member and the floor-side member; and
the rack provided on the floor and to which the article is transferred by the transferring part of the suspended transport vehicle.

7. The storage system according to claim 6,
wherein the ceiling-side member includes a mast extending downwards from the traveling part and a vertically-moving part provided so as to be capable of vertical movement along the mast and on which the transferring part is provided,
the suspended transport vehicle further comprises a controller configured to control vertical movement of the vertically-moving part, and
the controller is configured to determine a height position of the vertically-moving part when transferring the article to the shelf of the rack based on the relative distance detected by the distance detecting part.

8. The storage system according to claim 7,
wherein the floor-side member includes a travel roller being the contacting part and an inclination-preventing guide roller guided by a guide member provided on the floor and being configured to prevent the mast from inclining at a predetermined angle or more from the vertical direction.

9. The storage system according to claim 6,
wherein the distance detecting part includes a reflective member and a distance sensor configured to detect a distance to the reflective member, and
the ceiling-side member is provided with the reflective member and the floor-side member is provided with the distance sensor or the ceiling-side member is provided with the distance sensor and the floor-side member is provided with the reflective member.

10. The storage system according to claim 9, wherein the distance sensor is provided in the ceiling-side member and the reflective member is provided in the floor-side member.

\* \* \* \* \*